United States Patent
Brush et al.

(10) Patent No.: US 11,644,488 B2
(45) Date of Patent: May 9, 2023

(54) DC POWER RAIL PROBES AND MEASUREMENT METHODS

(71) Applicant: Keysight Technologies, Inc., Santa Rosa, CA (US)

(72) Inventors: Edward Vernon Brush, Colorado Springs, CO (US); Michael Thomas McTigue, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 163 days.

(21) Appl. No.: 17/096,145

(22) Filed: Nov. 12, 2020

(65) Prior Publication Data

US 2021/0199700 A1     Jul. 1, 2021

Related U.S. Application Data

(60) Provisional application No. 62/955,639, filed on Dec. 31, 2019.

(51) Int. Cl.
*G01R 19/22* (2006.01)
*G01R 19/00* (2006.01)
*G01R 13/02* (2006.01)

(52) U.S. Cl.
CPC ......... *G01R 19/22* (2013.01); *G01R 13/0218* (2013.01); *G01R 19/0046* (2013.01)

(58) Field of Classification Search
CPC ................ G01R 1/07307; G01R 1/07342
See application file for complete search history.

(56) References Cited

U.S. PATENT DOCUMENTS

2003/0025485 A1* 2/2003 McTigue .................. G01R 1/20
                                                                                               324/72.5
2006/0061348 A1* 3/2006 Cannon .............. G01R 1/06788
                                                                                               324/72.5

FOREIGN PATENT DOCUMENTS

| CN | 102735887 B | 8/2014 |
|---|---|---|
| CN | 106932627 A | 7/2017 |
| JP | 2020028058 A | 2/2020 |

OTHER PUBLICATIONS

English translation of CN102735887B, 12 pgs.
English translation of CN106932627A, 10 pgs.
English translation of JP2020028058A, 17 pgs.

* cited by examiner

*Primary Examiner* — Tung X Nguyen (57) ABSTRACT

A direct current (DC) power rail probe includes a single-ended probe tip, and a two-path circuit having an input coupled to the single-ended probe tip and an output configured for connection to measurement equipment such as an oscilloscope. The two-path circuit includes an alternating current (AC) path in parallel with a feed-forward (FF) path, the AC path including a capacitive element, and the FF path including a series connection of at least one resistive element and an amplifier. The probe tip and two-path circuit are selectively operable in a non-attenuating mode and an attenuating mode.

20 Claims, 9 Drawing Sheets

DC POWER RAIL PROBES AND MEASUREMENT METHODS

CROSS REFERENCE TO RELATED APPLICATIONS

This application claims priority under 35 U.S.C. § 119(e) from commonly owned U.S. Provisional Application No. 62/955,639 to Edward V. Brush, et al. entitled "DC Power Rail Probes and Measurement Methods" filed on Dec. 31, 2019. The entire disclosure of U.S. Provisional Application 62/955,639 is hereby incorporated by reference in its entirety.

BACKGROUND

The increased functionality, higher density, and higher frequency operation of many modern electronic products has driven the need for lower supply voltages. It is common in many present-day designs to have DC supplies as low as 1.1 volts, and tighter tolerances accompany each new generation of products. As a result, it has become an increasing challenge to provide design engineers with the tools necessary to analyze DC power rails. Such analysis typically entails the use of an oscilloscope to look for transients, measure ripple, analyze coupling, and so on. An oscilloscope often does not have enough offset to be able to shift the DC power rail to the center of the screen for the required measurements. Even if the oscilloscope being used has enough offset to center the supply on the screen, the oscilloscope can change the behavior of the supply resulting in inaccurate characterization. Placing a DC blocking capacitor in the signal path eliminates the offset problem but also eliminates relevant DC information such as DC supply compression or low frequency drift.

One solution to these challenges has been to utilize a specially designed DC power rail probe for users making power integrity measurements that need mV sensitivity when measuring noise, ripple and transients on DC power rails. A low noise measurement solution is of paramount importance to avoid confusing the noise of the probe and oscilloscope with the noise and ripple of the DC supply being measured. Using probes (active or passive) that are higher than 1:1 attenuation can help with the offset difficulty but will also decrease the signal-to-noise ratio and negatively affect measurement accuracy. Using the oscilloscope's 50Ω input with a passive coaxial cable offers a 1:1 attenuation ratio probing method, but results in higher-than-desired DC loading of the supply being measured and has the offset limitations mentioned earlier. Ripple, noise, and transients riding on DC supplies are a major source of clock and date jitter in digital systems. Dynamic loading of the DC supply by the processor, memory, or similar items occurs at the clock frequency and can create high speed transients and noise on the DC supply that can easily have content above 1 GHz. Designers increasingly need high-bandwidth tools to evaluate and understand high-speed noise and transients on DC power rails.

SUMMARY

According to an aspect of the inventive concepts, a direct current (DC) power rail probe is provided which includes a single-ended probe tip, and a two-path circuit having an input coupled to the single-ended probe tip and an output configured for connection to measurement equipment. The two-path circuit includes an alternating current (AC) path in parallel with a feed-forward (FF) path, where the AC path includes a capacitive element, and the FF path includes a series connection of at least one resistive element and an amplifier. The probe tip and two-path circuit are selectively operable in a non-attenuating mode and an attenuating mode.

The DC power rail probe may further include a detachable tip resistor that is attached to the probe tip in the attenuating mode, and detached from the probe tip in the non-attenuating mode.

The DC power rail probe may further include a resistive probe tip and a switch configured to connect the single-ended probe tip to the two-path circuit in the non-attenuating mode, and to connect the resistive probe tip to the two-path circuit in the attenuating mode.

The DC power rail probe may further include a blocking switch in the AC path of the two-path circuit, where the blocking switch is closed in the non-attenuating mode, and open in the attenuating mode.

The DC power rail probe may further include an attenuating circuit in the AC path of the two-path circuit in series with the capacitive element, and at least one bypass switch for selectively bypassing the attenuating circuit in the AC path. In this case, the attenuating circuit is operative to attenuate the AC path in the attenuating mode, and the bypass switch bypasses the attenuating circuit in the AC path in the non-attenuating mode. The attenuating circuit may be a matching Pi attenuator, and a resistance of the attenuating circuit may be 50Ω.

The measurement equipment may be an oscilloscope, and the output of the two-path circuit may be configured for connection to a 50Ω input of the oscilloscope.

According to another aspect of the inventive concepts, a measurement system is provided which includes an oscilloscope and a single-ended DC power rail probe connected to an input of the oscilloscope. The single-ended DC power rail probe is configured to be selectively operative in a non-attenuating mode and an attenuating mode.

The DC power rail probe of the measurement system may include a single-ended probe tip and a two-path circuit having an input coupled to the single-ended probe tip and an output connected to the input of the oscilloscope. In this case, the two-path circuit includes an alternating current (AC) path in parallel with a feed-forward (FF) path, where the AC path includes a capacitive element, and the FF path includes a series connection of at least one resistive element and an amplifier.

The input of the oscilloscope may be a 50Ω input.

The DC power rail probe of the measurement system may further include a detachable tip resistor that is attached to the single-ended probe tip in the attenuating mode, and detached from the single-ended probe tip in the non-attenuating mode.

The DC power rail probe of the measurement system may further include a resistive probe tip and a switch, where the switch is configured to connect the single-ended probe tip to the two-path circuit in the non-attenuating mode, and to connect the resistive probe tip to the two-path circuit in the attenuating mode.

The DC power rail probe of the measurement system may further include a blocking switch in AC path of the two-path circuit, where the blocking switch is open to block the AC path in the non-attenuating mode, and closed in the attenuating mode.

The DC power rail probe of the measurement system may further include an attenuating circuit in the AC path of the two-path circuit in series with the capacitive element, and a bypass switch for selectively bypassing the attenuating circuit in the AC path. In this case, the attenuating circuit is operative to attenuate the AC path in the attenuating mode, and the bypass switch bypasses the attenuating circuit in the AC path in the non-attenuating mode. The attenuating circuit may be a matching Pi attenuator, and may match an input resistance of the input of the oscilloscope. A resistance of the attenuating circuit may be 50Ω.

According to yet another aspect of the inventive concepts, a method of measuring a DC voltage is provided which includes attaching a single-ended DC power rail probe to an input of an oscilloscope, changing an attenuation of the single-ended DC power rail probe from a non-attenuating mode to an attenuating mode, and contacting the DC power rail probe to a DC power rail to measure a voltage of the DC power rail in the attenuating mode.

The single-ended DC power rail probe may include a two-path circuit having an input coupled to a probe tip and an output configured for connection to the input of the oscilloscope, the two-path circuit including an alternating current (AC) path in parallel with a feed-forward (FF) path, where the AC path includes a capacitive element, and the FF path includes a series connection of resistive elements and an amplifier. In this case, the single-ended DC power rail probe is changed to the attenuating mode by adding a resistance in the AC path of the two-path circuit.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION

The embodiments described herein generally relate to probes configured to detect a direct current (DC) voltage and supply the detected DC voltage to measurement/analysis equipment such as an oscilloscope in particular, the embodiments are directed to detecting a DC power voltage present on a DC power rail of an electronic device or circuit board. For this reason, die probes of the embodiments are referred to herein as DC power rail probes. The embodiments, however, are not limited by the terminology of the DC power system being analyzed.

Figure 1:
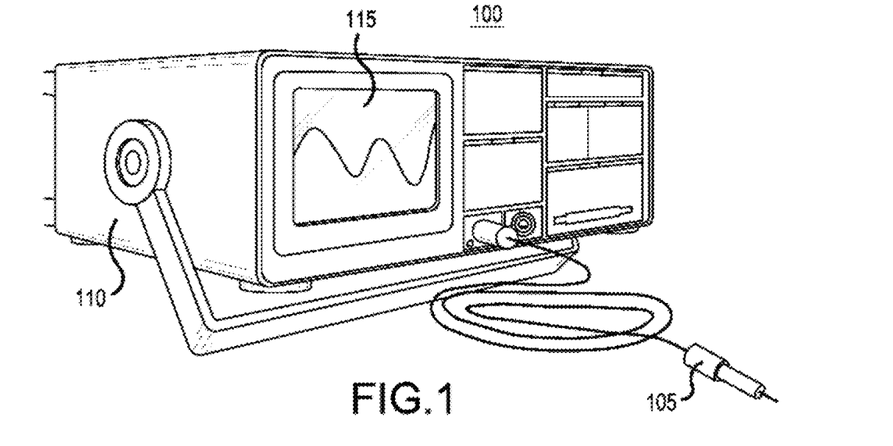
FIG. 1 is a schematic diagram of a measurement system 100 according to a representative embodiment.

FIG. 1 is a schematic diagram of a measurement system 100 according to a representative embodiment.

Referring to 1G. 1, the measurement system 100 of this example includes a single-ended DC power rail probe 105 and an oscilloscope 110. During a typical operation of the measurement system 100, a user applies a probe tip of the probe 105 to a test point of a device-under-test (DUT). Upon contacting the test point, the probe 105 detects a voltage signal at the test point and transmits the voltage signal to the oscilloscope 110. The oscilloscope 110 then converts the signal into a waveform to be displayed on a display 115 of the oscilloscope 110.

Figure 2:
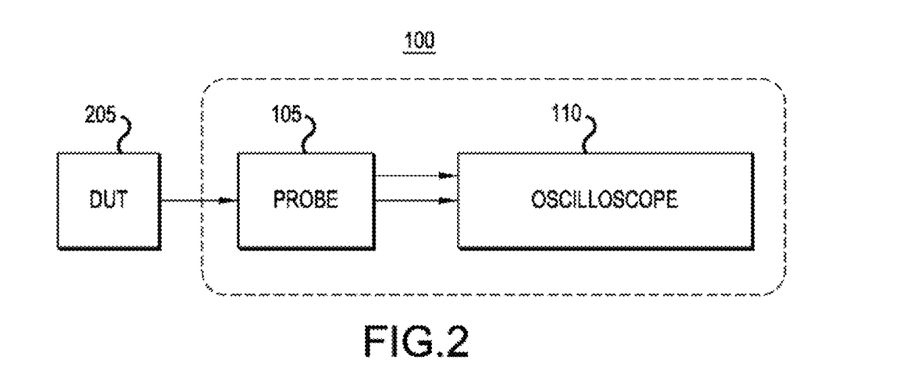
FIG. 2 is block diagram of a measurement system including a device under test (DUT) according to a representative embodiment.

The oscilloscope 110 receives the output signals of probe 105 as input signals and performs processing on the received input signals. This processing may include, for instance, amplification by an input amplifier and digitization by an analog-to-digital converter (ADC). The digitization produces a stream of digital values to be presented on the display 115. The input amplifier and/or ADC are typically configured to amplify and/or digitize signals according to a range of values that can be presented on the display 115. This range, also referred to as the "full screen range" of display 115, is typically specified by a number of vertical divisions of the display 115 and a number of volts per division (V/div). This range can be adjusted by changing the attenuation of oscilloscope probe 105 and/or the input amplifier, for example. In a typical implementation, the full screen range is slightly lower than the dynamic range of the input amplifier and ADC, so these components do not immediately saturate when the input voltage of oscilloscope 110 exceeds the full screen range, FIG. 2 is a block diagram of a measurement system including a DUT according to a representative embodiment. This diagram is presented as a simple illustration of the signal flow from a DUT 205 to oscilloscope 110. Referring to FIG. 2, when the probe 105 is in contact with the DUT 205, a voltage signal is transmitted from the DUT 205 to oscilloscope probe 105 along one or more signal paths. The signal is transmitted to the oscilloscope 110 where it is amplified, digitized, and presented on the display 115.

Figure 3:
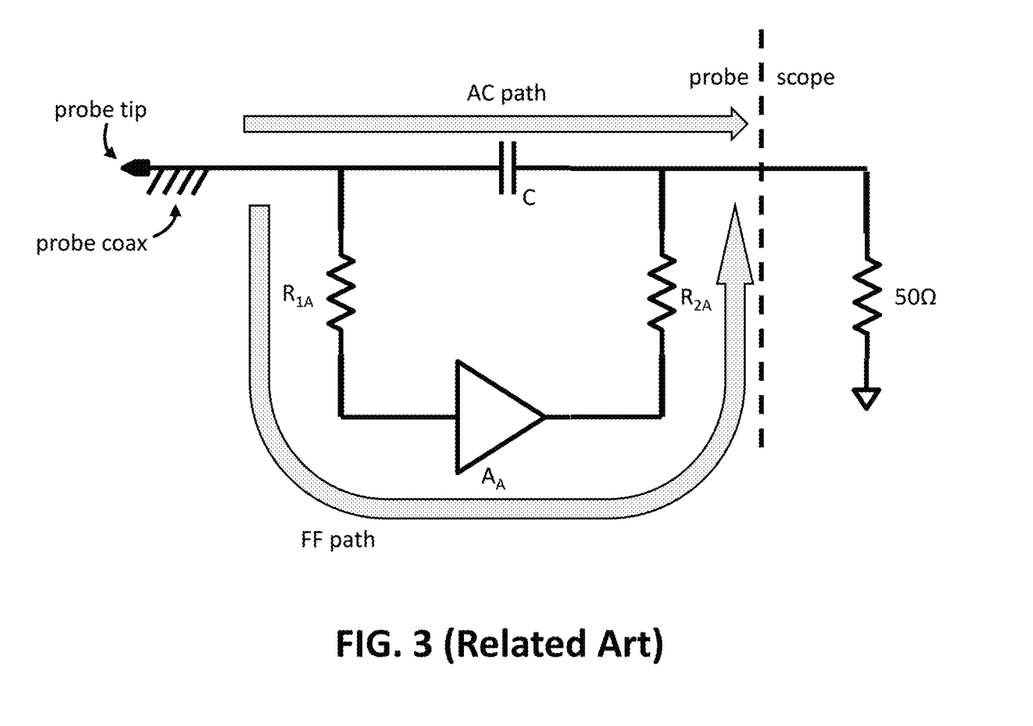
FIG. 3 is a circuit diagram for reference in describing a related DC power rail probe.

FIG. 3 is a simplified circuit diagram of a related DC power rail probe.

Referring to FIG. 3, the related DC power rail probe includes a probe tip connected to a coaxial cable (probe coax), which feeds a circuit configured of a capacitance C in parallel with the series combination of a first resistance $R_{1A}$, an amplifier $A_A$ and a second resistance $R_{2A}$. The probe tip may be a pin-like protrusion or wire which is configured to be temporarily (e.g., manually or using a probe stand) in contact with a power rail of the DUT. Alternatively, the probe tip may be connected to the power rail by solder and the like.

The output of the probe circuit is fed to an input of an oscilloscope (e.g., the 50Ω input of the oscilloscope). A power rail probe of this type is available from Keysight Technologies with a product designation N7020A. The N7020A probe is a stand-alone unit which connects directly to the oscilloscope and has a fixed attenuation of roughly 1:1. This low attenuation ratio provides a superior signal-to-noise ratio. The N7020A probe can measure voltages up to +/−24V with an input voltage range of +/−850 mV. In addition, this probe has a large 50 kΩ DC input impedance which minimizes the probe DC loading of the rails it probes, and a high 2 GHz bandwidth which allows for the capture of fast transients and noise caused by switching currents within the system being tested. As those skilled in the art will understand, the probe of this type is a single-ended implementation having a single-ended probe tip, as opposed to a differential implementation having a pair of differential probe tips.

The probe architecture of FIG. 3 is characterized by a 2-path design which includes a passive AC high frequency path ("AC path") and an amplified low frequency path, called a feed forward path ("FF path"). At high frequencies, the impedance of the capacitor C approaches 0Ω, and therefore the AC path effectively bypasses the FF path. On the other hand, at low frequencies, the impedance of the capacitor C approaches ∞, thus effectively blocking the AC path. Because the AC path is passive, it is relatively easy to design. The FF path is also relatively easy to implement because it does not need a high bandwidth and can be implemented with readily available op-amps.

The N7020A probe has advantageous capabilities in looking at the fine details on a power rail, but it has a limitation in that is it is unable to view power supply deviations greater than the probe's input range of +/−850 mV. Such deviations can occur, for example, when a supply of a DUT is turned on and off. The N7020A probe is good at measuring a supply that is at steady state, but any supply deviation greater than the probe's input range cannot be measured. The embodiments described later add selectable attenuation in the power rail probe architecture that allows it to measure large input voltage deviations.

As just mentioned, one drawback of the N7020A architecture (FIG. 3) is that it cannot measure a wide input voltage (excluding DC offset voltage). In order to maintain a high quality, high frequency 50Ω path with minimal attenuation, the dividing resistor on the output of the FF path needs to be relatively large, and this is one of the main tradeoffs that limits the input range of the probe.

Adding attenuation comes at two primary tradeoffs: design complexity and noise. Adding attenuation to a probe inherently adds noise. Therefore, according to the embodiments, the attenuation is selectable which gives the user the option of 1:1 attenuation with limited input voltage range or a higher attenuation with wider input range. These embodiments will now be described in turn with reference to FIGS. 4-9.

Figure 4:
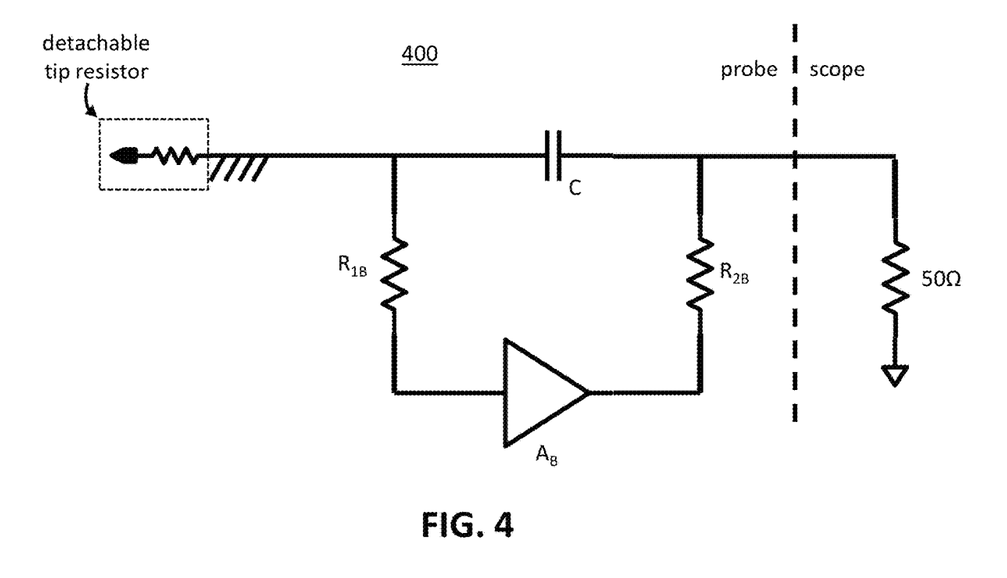
FIG. 4 is a circuit diagram for reference in describing a DC power rail probe according to an embodiment of the inventive concepts.

FIG. 4 is a circuit diagram for reference in describing a DC power rail probe 400 according to an embodiment of the inventive concepts.

Like the configuration of the related example of FIG. 3, the embodiment of FIG. 4 includes a circuit composed of a capacitor C in parallel with the series connection of a first resistance $R_{1B}$, an amplifier $A_B$ and a second resistance $R_{2B}$. The probe architecture of FIG. 4 is thus characterized by the previously described 2-path design which includes a passive AC high frequency path ("AC path") and an amplified low frequency path, called a feed forward path ("FF path"). The embodiment of FIG. 4 is further characterized by the provision of a detachable tip resistor. As such, two distinct physical connection modes are available for the user to connect to the DUT. These modes are referred to herein as a non-attenuating mode and an attenuating mode. In the non-attenuating mode, the user establishes a direct connection (i.e., without the detachable tip resistor), thereby setting the attenuation to 1:1 (like the N7020A probe described above). On the other hand, in the attenuating mode, the customer uses the tip resistor, in which case the gain of the AC path changes. When this connection is made known to the oscilloscope, it can reconfigure the FF path gain to match the AC path gain, thus providing an attenuated and flat frequency response across the entire bandwidth.

Adding a tip resistor at the input of the probe cable creates a resistive divider, and thus an attenuator, on the AC path. In other words, in the case of a 50Ω input, a gain $A_{AC}$ in the AC path becomes $50/(R_{tip}+50)$, where $R_{tip}$ is the resistance of the tip resistor. Since the tip resistance $R_{tip}$ is typically small compared to the DC input resistance, it has minimal impact on the FF gain and thus a switch may be enabled to change the gain of the FF path. That is, the gain AB in the FF path may be changed to match the gain $A_{AC}$ in the AC path. Once the signal has been attenuated and the gain paths adjusted, the input range of the probe increases by the amount of the attenuation, allowing larger input voltages to be measured.

In other embodiments, the probe is equipped with multiple detachable tip resistors having different resistance values, thus allowing for multiple different attenuations corresponding to the different tip resistance values.

The use of tip resistors in differential, always-attenuating probes is known. However, the embodiment of FIG. 4 departs from such configurations by the use of a tip resistor in a single-ended implementation having little-to-no attenuation when a direction connection is established. The embodiment of FIG. 4 offers the advantage of a relatively simple design, and the AC path in the probe remains untouched which eases design complexity and increases signal integrity and bandwidth. Also, the AC loading improves in the attenuating mode because the tip resistor is included in the input impedance of the probe.

Figure 5:
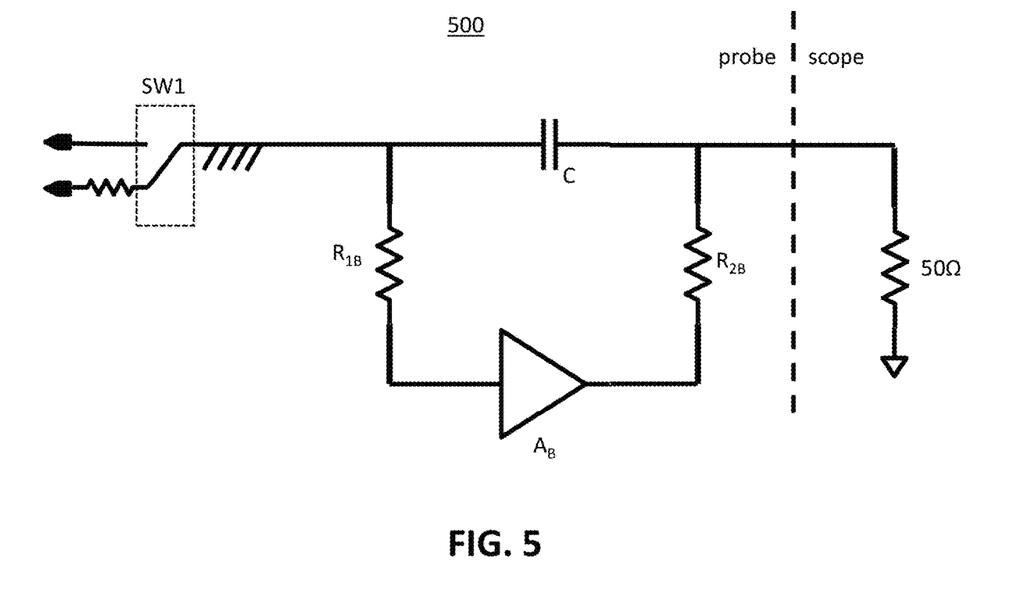
FIG. 5 is a circuit diagram for reference in describing a DC power rail probe according to another embodiment of the inventive concepts.

FIG. 5 is a circuit diagram for reference in describing a DC power rail probe 500 according to another embodiment of the inventive concepts.

Like the configuration of the embodiment of FIG. 4, the embodiment of FIG. 5 includes a circuit composed of a capacitor C in parallel with the series connection of a first resistance $R_{1B}$, an amplifier $A_B$ and a second resistance $R_{2B}$. Like the previous embodiment, the probe architecture of FIG. 4 is characterized by a 2-path design which includes a passive AC high frequency path ("AC path") and an amplified low frequency path, called a feed forward path ("FF path"). The embodiment of FIG. 5 is further characterized by the provision of a switch SW1 coupled to the coax probe cable. The switch SW1 of this embodiment has two positions for realizing two distinct physical connection modes to the DUT. Like the previous embodiment, these modes are referred to as a non-attenuating mode and an attenuating mode. In the non-attenuating mode, the switch SW1 is set to establish a direct connection (i.e., without a tip resistor), thereby setting the attenuation to 1:1 (like the N7020A probe). In the attenuating mode, the switch SW1 is set to connect a resistive probe tip to the two-path circuit, in which case the gain of the AC path changes. As with the previous embodiment, when this connection is made known to the oscilloscope, it can reconfigure the FF path gain to match the AC path gain, thus providing an attenuated and flat frequency response across the entire bandwidth.

As with the embodiment of FIG. 4, operating the switch SW1 to add the resistance of the resistive probe tip at the input of the probe cable creates a resistive divider, and thus an attenuator, on the AC path. As before, in the case of a 50Ω input, a gain $A_{AC}$ in the AC path becomes $50/(R_{tip}+50)$, where $R_{tip}$ is the resistance of the tip resistor. Because the tip resistance $R_{tip}$ is typically small compared to the DC input resistance, it has minimal impact on the FF gain and thus a switch may be enabled to change the gain of the FF path. That is, the gain AB in the FF path may be changed to match the gain $A_{AC}$ in the AC path. Once the signal has been attenuated and the gain paths adjusted, the input range of the probe increases by the amount of the attenuation, allowing larger input voltages to be measured.

In alternative embodiments, the probe is equipped with a multi-positioned switch for selectively adding any one of multiple resistive tip probe having different resistance values, thus allowing for multiple different attenuation modes corresponding to the different tip resistance values.

Figure 6:
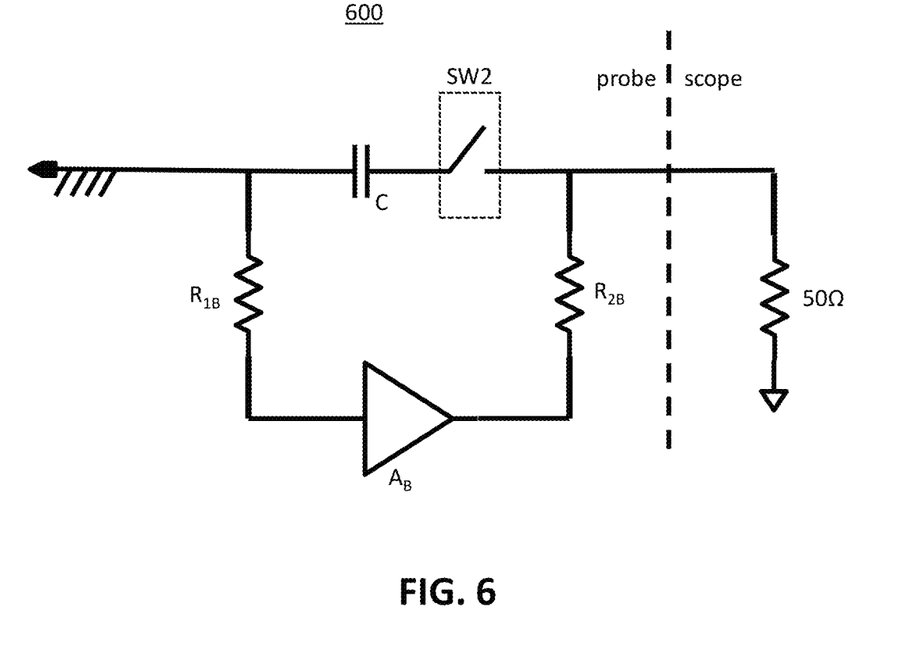
FIG. 6 is a circuit diagram for reference in describing a DC power rail probe according to another embodiment of the inventive concepts.

FIG. 6 is a circuit diagram for reference in describing a DC power rail probe 600 according to another embodiment of the inventive concepts.

Referring to FIG. 6, the DC power rail probe 600 of this embodiment includes a probe tip connected to a coaxial cable (probe coax), which feeds a circuit composed of a capacitor C in parallel with the series connection of a first resistance $R_{1B}$, an amplifier $A_B$ and a second resistance $R_{2B}$. As with the previous embodiments, the probe architecture of FIG. 6 is characterized by a 2-path design which includes a passive AC high frequency path ("AC path") and an amplified low frequency path, called a feed forward path ("FF path").

The embodiment of FIG. 6 is characterized by the inclusion of a blocking switch SW2 in the AC path of the 2-path circuit. The blocking switch SW2 may be a radio-frequency (RF) switch. The blocking switch SW2 is closed in the non-attenuating mode, in which case the probe 600 functions with an attenuation of 1:1 like the N7020A probe of the related art.

On the other hand, in the attenuating mode the blocking switch SW2 is open, thus switching out the AC path. This drastically reduces the bandwidth of the probe, but it allows the attenuation to be selected solely in probe circuit by modifying the gain $A_B$ to attenuate a large input voltage on the FF path. In the attenuating mode, the probe bandwidth is the FF path bandwidth, but can be used to measure large input voltages. The "2-path" design becomes "1-path," with the FF path being the only circuit passing signal. In the case of voltage supplies turning on and off, these are typically much slower, with bandwidth requirements well within what can be accomplished in the FF path.

The embodiment of FIG. 6 has the ability to change probe attenuation with the same physical connection to the DUT (e.g., without a tip resistor), thus giving the probe the ability to make non-attenuated measurements and, additionally, measure high input voltages in the attenuating mode. For the non-attenuating mode, the blocking switch SW2 is closed and the gain $A_B$ is the same as that $A_A$ of the related probe of FIG. 3. In the attenuating mode, the blocking switch SW2 is open and $A_B$ is modified to attenuate a large input voltage on the FF path.

Figure 7:
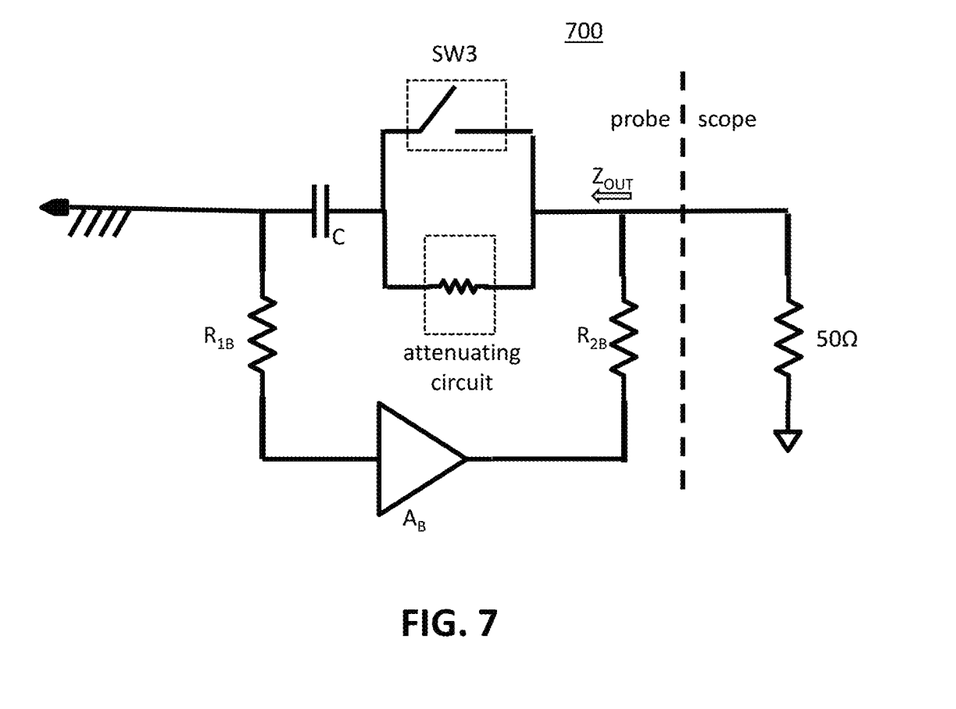
FIG. 7 is a circuit diagram for reference in describing a DC power rail probe according to another embodiment of the inventive concepts.

FIG. 7 is a circuit diagram for reference in describing a DC power rail probe 700 according to another embodiment of the inventive concepts.

Referring to FIG. 7, the DC power rail probe 700 of this embodiment includes a probe tip connected to a coaxial cable (probe coax), which feeds a circuit composed of a capacitor C in parallel with the series connection of a first resistance $R_{1B}$, an amplifier $A_B$ and a second resistance $R_{2B}$. As with the previous embodiments, the probe architecture of FIG. 7 is characterized by a 2-path design which includes a passive AC high frequency path ("AC path") and an amplified low frequency path, called a feed forward path ("FF path").

The embodiment of FIG. 7 is further characterized by an attenuator circuit and a bypass switch SW3 in the AC path of the 2-path circuit. The bypass switch SW3 may be an RF switch. As shown, the bypass switch SW3 is connected across the attenuator circuit to allow selective inclusion of the attenuator circuit in the AC path of the 2-path circuit. That is, referring to FIG. 7, when the bypass switch SW3 is in a closed state, the attenuator circuit is bypassed, and the probe 700 functions in a non-attenuating mode with an attenuation of 1:1 like the N7020A probe of the related art (FIG. 3).

On the other hand, when the bypass switch SW3 is open, the attenuator is included in the AC path to establish the attenuating mode of the probe 700. Also, the gain of the FF path may be modified in a manner similar to that described above in connection with the embodiment of FIG. 6. This allows the attenuation modes to be controlled electronically without having to change the tip resistor. Also, the frequency response can be matched for both attenuation modes. In other words, a full-bandwidth can be achieved with the attenuated case, while still maintaining high impedance (and thus low loading) and without requiring any physical probe tip changes.

In the case where the input to the oscilloscope is a 50Ω input, the attenuator circuit of FIG. 7 may be a 50Ω attenuator. There are many ways to incorporate the attenuator and each has tradeoffs, mostly associated with the FF path. The main tradeoffs are attenuation, FF amplifier output voltage, and FF amplifier bandwidth.

Figure 8:
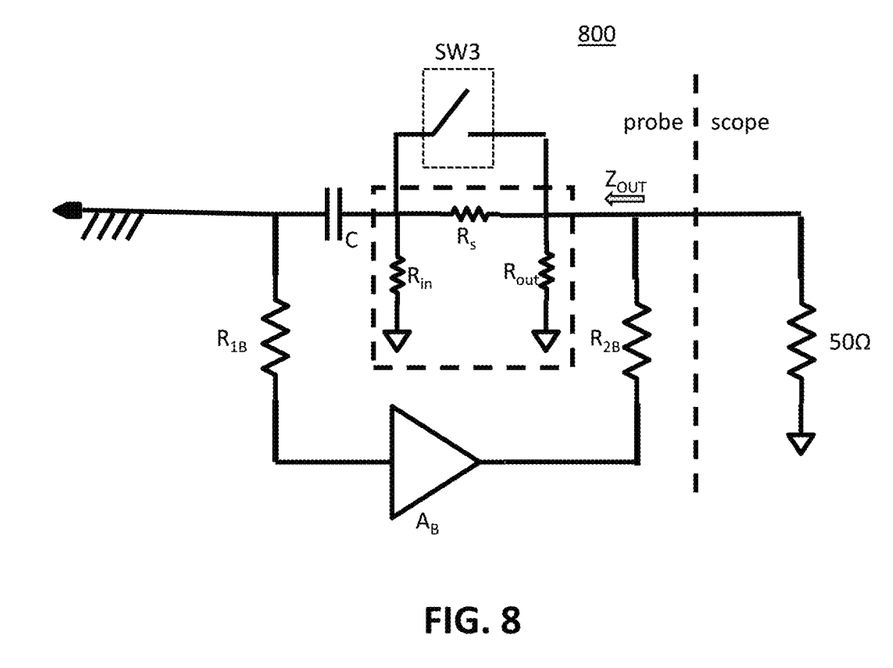
FIG. 8 is a circuit diagram for reference in describing a DC power rail probe according to another embodiment of the inventive concepts.

FIG. 8 is a circuit diagram for reference in describing an example of a DC power rail probe 800 in which the attenuator circuit of FIG. 7 is realized by a matching Pi attenuator.

Referring to FIG. 8, the matching Pi attenuator includes resistive elements $R_{in}$, $R_s$ and $R_{out}$ as shown. In the embodiment of this example, the bypass switch SW3 is closed in the non-attenuating mode as described previously. On the other hand, in the attenuating mode the bypass switch SW3 is open to introduce the matching Pi attenuator into the AC path. Here, the gain $A_B$ may be set to match the AC gain. In this example, $R_{2B}$ and $R_{out}$ may be set so that their parallel combination equals $R_{in}$. The value of $R_{out}$ may be chosen such that it maximizes the ability of the FF amplifier to fully drive an output at the proper attenuation. By minimizing attenuation, the signal-to-noise ratio of the probe is maximized. Other cases with higher attenuation may be more easily realized. In an alternative embodiment of the matching Pi attenuator, $R_{2B}$ and $R_{out}$ are combined into a single resistor serving the purposes of both $R_{2B}$ and $R_{out}$.

Figure 9:
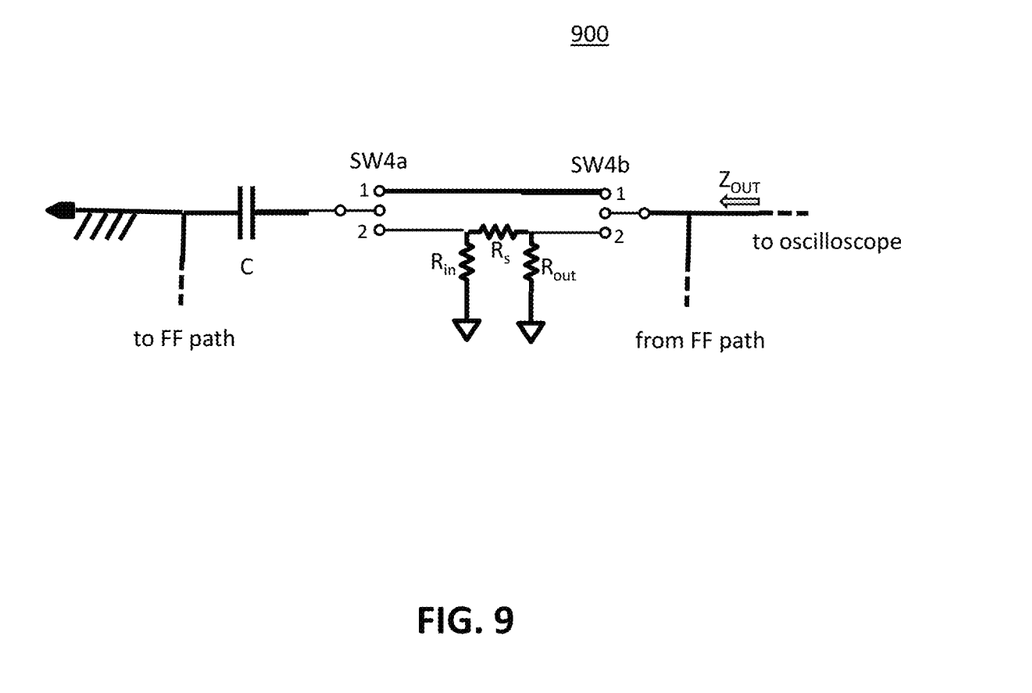
FIG. 9 is a circuit diagram for reference in describing a DC power rail probe according to another embodiment of the inventive concepts.

FIG. 9 is a circuit diagram for reference in describing a DC power rail probe 900 according to another embodiment of the inventive concepts.

It may be preferable to increase the electrical isolation of the attenuator circuit (e.g., the matching Pi attenuator of FIG. 8) during the non-attenuating mode. FIG. 9 illustrates an example of the AC path for achieving increased attenuator circuit isolation by the provision of a pair of bypass switches SW4a and SW4b. In this example, the attenuator circuit is implemented as a matching Pi attenuator like that of FIG. 8 including resistive elements $R_{in}$, $R_s$ and $R_{out}$ as shown. As mentioned above in connection with FIG. 8, $R_{out}$ may be combined with $R_{2B}$ of the FF path. Also in this example, the pair of bypass switches SW4a and SW4b are implemented by single-pull-double-throw (SPDT) switches which may be RF SPDT switches. In the non-attenuating mode, the SPDT switches SW4a and SW4b are in the switch position 1 shown in FIG. 9, thereby by-passing and electrically isolating the attenuator circuit (e.g., matching Pi attenuator) from the AC path. In the attenuating mode, the SPDT switches SW4a and SW4b are in the switch position 2 of FIG. 9, thereby introducing the attenuator circuit into the AC path. In this state, the circuit operates as described above in connection with FIGS. 7 and 8.

Figure 10:
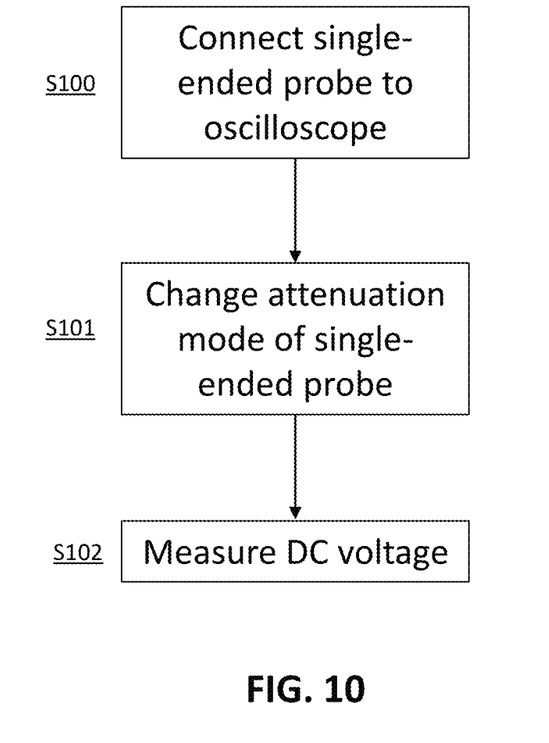
FIG. 10 is a flowchart for reference in describing a method of measuring a DC voltage according to embodiments of the inventive concepts.

FIG. 10 is a flowchart for briefly describing methods of measuring a DC voltage having a supply deviation greater than the probe's normal (non-attenuating) input range according to embodiments of the inventive concepts. It is noted that the ordering of the process steps is not limited to that shown in FIG. 9.

Initially, a single-ended DC power rail probe is connected to an oscilloscope (S101). The connection may be made, for example, to a 50Ω input of the oscilloscope.

Then, the single-ended DC power rail probe is switched from a non-attenuating mode to an attenuating mode (S102). As previously explained, this can be achieved adding attenuation at the probe tip (FIGS. 4 and 5), by blocking the AC path (FIG. 6), or by adding attenuation in the AC path (FIGS. 7, 8 and 9). Further, if necessary, adjustments may be made to the FF path under control of the oscilloscope.

Then the DC voltage is measured for display/analysis on the oscilloscope (S103). This is done with the probe tip being in contact with the DC voltage power rail of the DUT.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

What is claimed is:

1. A direct current (DC) power rail probe, comprising:
   a single-ended probe tip; and
   a two-path circuit having an input coupled to the single-ended probe tip and an output configured for connection to measurement equipment, the two-path circuit including an alternating current (AC) path in parallel with a feed-forward (FF) path, the AC path including a capacitive element, and the FF path including a series connection of at least one resistive element and an amplifier,
   wherein the single-ended probe tip and two-path circuit are selectively operable in a non-attenuating mode and an attenuating mode.

2. The DC power rail probe of claim 1, further comprising a detachable tip resistor that is attached to the single-ended probe tip in the attenuating mode, and detached from the single-ended probe tip in the non-attenuating mode.

3. The DC power rail probe of claim 1, further comprising a resistive probe tip and a switch configured to configured to connect the single-ended probe tip to the two-path circuit in the non-attenuating mode, and to connect the resistive probe tip to the two-path circuit in the attenuating mode.

4. The DC power rail probe of claim 1, further comprising a blocking switch in AC path of the two-path circuit,
   wherein the blocking switch is closed in the non-attenuating mode, and open in the attenuating mode.

5. The DC power rail probe of claim 1, further comprising an attenuating circuit in the AC path of the two-path circuit in series with the capacitive element, and at least one bypass switch for selectively bypassing the attenuating circuit in the AC path,
   wherein the attenuating circuit is operative to attenuate the AC path in the attenuating mode, and the at least one bypass switch bypasses the attenuating circuit in the AC path in the non-attenuating mode.

6. The DC power rail probe of claim 5, wherein the attenuating circuit is a matching Pi attenuator.

7. The DC power rail probe of claim 5, wherein a resistance of the attenuating circuit is 50Ω.

8. The DC power rail probe of claim 1, wherein the measurement equipment is an oscilloscope, and the output of the two-path circuit is configured for connection to a 50Ω input of the oscilloscope.

9. A measurement system comprising:
   an oscilloscope; and
   a single-ended direct current (DC) power rail probe connected to an input of the oscilloscope and configured to be selectively operative in a non-attenuating mode and an attenuating mode.

10. The measurement system of claim 9, wherein the DC power rail probe includes a single-ended probe tip, and
    a two-path circuit having an input coupled to the single-ended probe tip and an output connected to the input of the oscilloscope, the two-path circuit including an alternating current (AC) path in parallel with a feed-forward (FF) path, the AC path including a capacitive element, and the FF path including a series connection of resistive elements and an amplifier.

11. The measurement system of claim 10, wherein the input of the oscilloscope is a 50Ω input.

12. The measurement system of claim 10, further comprising a detachable tip resistor that is attached to the single-ended probe tip in the attenuating mode, and detached from the single-ended probe tip in the non-attenuating mode.

13. The measurement system of claim 10, further comprising a resistive probe tip and a switch configured to connect the single-ended probe tip to the two-path circuit in the non-attenuating mode, and to connect the resistive probe tip to the two-path circuit in the attenuating mode.

14. The measurement system of claim 10, further comprising a blocking switch in AC path of the two-path circuit,
    wherein the blocking switch is open to block the AC path in the non-attenuating mode, and closed in the attenuating mode.

15. The measurement system of claim 10, further comprising an attenuating circuit in the AC path of the two-path circuit in series with the capacitive element, and at least one bypass switch for selectively bypassing the attenuating circuit in the AC path,
    wherein the attenuating circuit is operative to attenuate the AC path in the attenuating mode, and the at least one bypass switch bypasses the attenuating circuit in the AC path in the non-attenuating mode.

16. The measurement system of claim 15, wherein the attenuating circuit is a matching Pi attenuator.

17. The measurement system of claim 15, wherein a resistance of the attenuating circuit matches an input resistance of the input of the oscilloscope.

18. The measurement system of claim 17, wherein a resistance of the attenuating circuit is 50Ω.

19. A method of measuring a direct current (DC) voltage, comprising:

attaching a single-ended DC power rail probe to an input of an oscilloscope;

changing an attenuation of the single-ended DC power rail probe from a non-attenuating mode to an attenuating mode; and contacting the DC power rail probe to a DC power rail to measure a voltage of the DC power rail in the attenuating mode.

20. The method of claim 19, wherein the single-ended DC power rail probe includes a two-path circuit having an input coupled to a probe tip and an output configured for connection to the input of the oscilloscope, the two-path circuit including an alternating current (AC) path in parallel with a feed-forward (FF) path, the AC path including a capacitive element, and the FF path including a series connection of resistive elements and an amplifier, wherein the single-ended DC power rail probe is changed to the attenuating mode by adding a resistance in the AC path of the two-path circuit.

* * * * *